(12) United States Patent
Sugita et al.

(10) Patent No.: US 11,513,194 B2
(45) Date of Patent: Nov. 29, 2022

(54) RANGING APPARATUS AND METHOD USING THE RANGING APPARATUS

(71) Applicant: Tokyo Electron Limited, Tokyo (JP)

(72) Inventors: Kippei Sugita, Miyagi (JP); Kenji Nagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 706 days.

(21) Appl. No.: 16/516,481

(22) Filed: Jul. 19, 2019

(65) Prior Publication Data
US 2020/0025884 A1  Jan. 23, 2020

(30) Foreign Application Priority Data

Jul. 20, 2018 (JP) .............................. JP2018-136764

(51) Int. Cl.
*G01S 7/481* (2006.01)
*G02B 6/34* (2006.01)
*H01J 37/244* (2006.01)

(52) U.S. Cl.
CPC .............. *G01S 7/4816* (2013.01); *G02B 6/34* (2013.01); *H01J 37/244* (2013.01); *H01J 2237/24578* (2013.01)

(58) Field of Classification Search
CPC .... G01S 7/4816; G01S 7/4812; G01S 7/4818; G01S 17/34; G02B 6/34; G02B 6/262; G02B 6/32; H01J 37/244; H01J 2237/24578; H01J 37/32935
See application file for complete search history.

(56) References Cited

U.S. PATENT DOCUMENTS

| 4,611,919 A * | 9/1986 | Brooks, Jr. ........ | G01B 11/0683 |
| | | | 216/60 |
| 4,969,200 A * | 11/1990 | Manns ................ | G03F 7/70725 |
| | | | 356/400 |
| 5,364,187 A * | 11/1994 | Thakur .................. | G01K 11/00 |
| | | | 374/161 |
| 2002/0082801 A1* | 6/2002 | Shiraishi ............... | G03F 9/7034 |
| | | | 702/155 |
| 2002/0107650 A1* | 8/2002 | Wack ..................... | G01N 21/47 |
| | | | 702/81 |

(Continued)

FOREIGN PATENT DOCUMENTS

JP  2018-054500 A  4/2018

*Primary Examiner* — David A Vanore
(74) *Attorney, Agent, or Firm* — Pearne & Gordon LLP

(57) ABSTRACT

A ranging apparatus for use in a plasma processing chamber having an internal space and a window is disclosed. The ranging apparatus includes at least one external light emitting device disposed external to the plasma processing chamber. The external light emitting device emits at least one source light beam to the internal space through the window. The ranging apparatus includes a base wafer disposed on a stage in the internal space. The ranging apparatus includes at least one optical circuit fixed to the base wafer. The optical circuit deflects the source light beam to a target in the internal space, and deflects a reflection light beam to the window. The ranging apparatus includes at least one external light receiving device disposed external to the plasma processing chamber. The external light receiving device receives the deflected reflection light beam through the window.

3 Claims, 6 Drawing Sheets

(56) References Cited

U.S. PATENT DOCUMENTS

| | | | |
|---|---|---|---|
| 2014/0286375 A1* | 9/2014 | Abe | G01K 11/125 |
| | | | 374/129 |
| 2015/0162233 A1* | 6/2015 | Nagai | G01B 11/14 |
| | | | 156/345.28 |
| 2018/0301322 A1* | 10/2018 | Sugita | H01J 37/32733 |
| 2019/0033103 A1* | 1/2019 | Sugita | H01J 37/32183 |
| 2020/0025884 A1* | 1/2020 | Sugita | G02B 6/32 |
| 2021/0074564 A1* | 3/2021 | Sugita | G01B 11/0625 |
| 2021/0356324 A1* | 11/2021 | Sugita | H05B 45/22 |

\* cited by examiner

RANGING APPARATUS AND METHOD USING THE RANGING APPARATUS

CROSS-REFERENCE TO RELATED APPLICATION

This application claims the benefit of Japanese Patent Application No. 2018-136764 filed on Jul. 20, 2018, the entire disclosure of which is incorporated herein by reference.

TECHNICAL FIELD

The various aspects and embodiments described herein pertain generally to a ranging apparatus and a method using the ranging apparatus.

BACKGROUND

There is known a ranging apparatus configured to detect a position of an object placed within a chamber in which a semiconductor substrate is plasma-processed (see Patent Document 1).

Patent Document 1: Japanese Patent Laid-open Publication No. 2018-054500

SUMMARY

Exemplary embodiments provide a ranging apparatus and a ranging method capable of easily measuring a position of a target object placed in an internal space of a chamber.

In one exemplary embodiment, a ranging apparatus for use in a plasma processing chamber having an internal space and a window includes at least one external light emitting device disposed external to the plasma processing chamber. The external light emitting device emits at least one source light beam to the internal space through the window. The ranging apparatus includes a base wafer disposed on a stage in the internal space. The ranging apparatus includes at least one optical circuit fixed to the base wafer. The optical circuit deflects the source light beam to a target in the internal space, and deflects a reflection light beam to the window. The ranging apparatus includes at least one external light receiving device disposed external to the plasma processing chamber. The external light receiving device receives the deflected reflection light beam through the window.

According to the exemplary embodiment, it is possible to easily measure a position of the target object placed in the internal space of the chamber.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
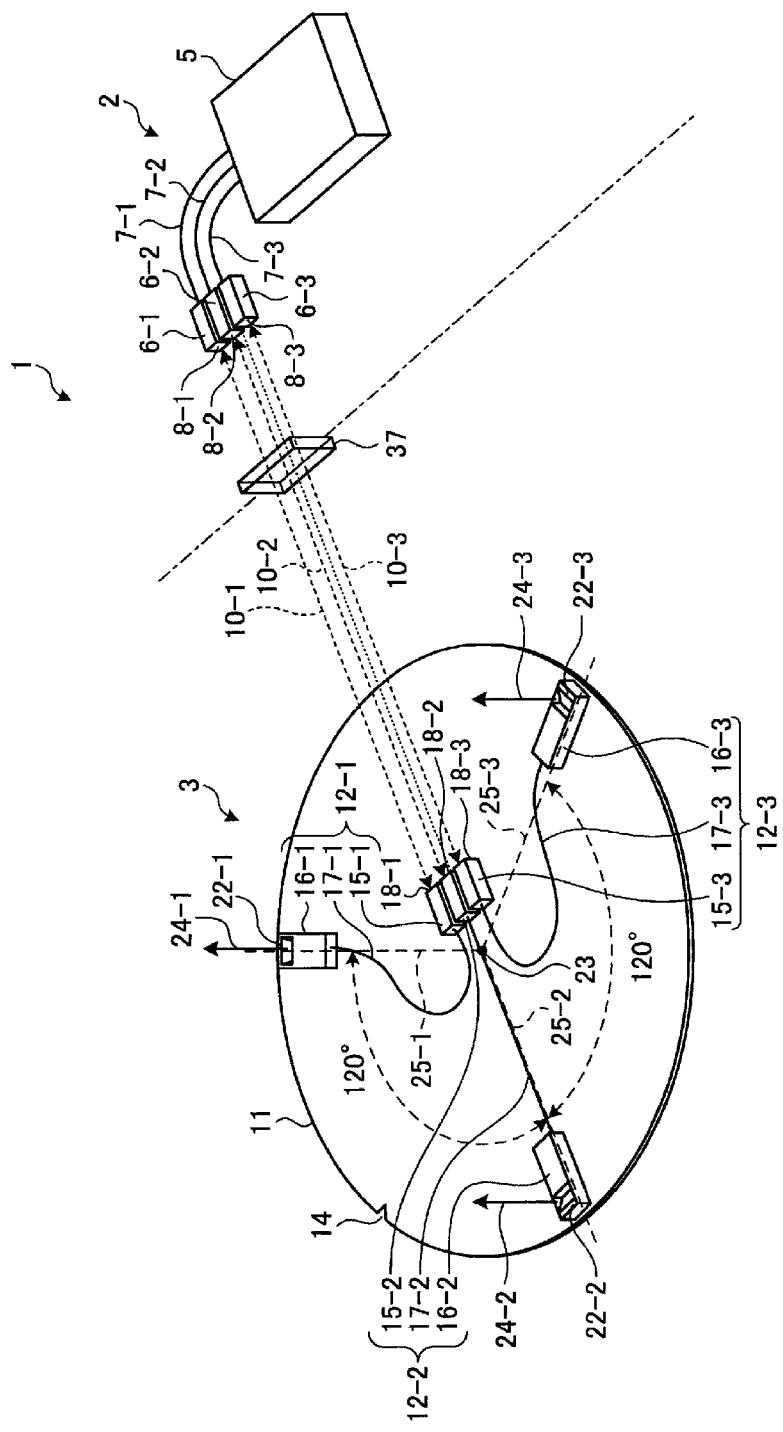
FIG. 1 is a perspective view illustrating an example of a ranging apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a ranging apparatus and a ranging method according to exemplary embodiments of the present disclosure will be described in detail with reference to the accompanying drawings.

<Configuration of Ranging Apparatus 1>

FIG. 1 is a perspective view illustrating an example of a ranging apparatus 1 according to an exemplary embodiment. As depicted in FIG. 1, the ranging apparatus 1 includes an external device 2 and a chamber-inside device 3. The external device 2 is equipped with a measurer 5, a plurality of collimators 6-1 to 6-3 and a plurality of optical fibers 7-1 to 7-3. Among the plurality of collimators 6-1 to 6-3, the collimator 6-1 is connected to the measurer 5 via the optical fiber 7-1 among the plurality of optical fibers 7-1 to 7-3.

The collimator 6-1 is provided with a light emitting/receiving opening 8-1. The collimator 6-1 converts light beam transmitted from the measurer 5 via the optical fiber 7-1 into a collimated light beam and emits the collimated light beam from the light emitting/receiving opening 8-1. Further, the collimator 6-1 transmits light beam reaching the light emitting/receiving opening 8-1 to the measurer 5 via the optical fiber 7-1.

Among the plurality of collimators 6-1 to 6-3, the collimator 6-2 is connected to the measurer 5 via the optical fiber 7-2 among the plurality of optical fibers 7-1 to 7-3. The collimator 6-2 is provided with a light emitting/receiving opening 8-2. The collimator 6-2 converts light beam transmitted from the measurer 5 via the optical fiber 7-2 into a collimated light beam and emits the collimated light beam from the light emitting/receiving opening 8-2. The collimator 6-2 also transmits light beam reaching the light emitting/receiving opening 8-2 to the measurer 5 via the optical fiber 7-2. The collimator 6-2 is fixed to the collimator 6-1 such that a straight line 10-2 along which the collimated light beam outputted from the light emitting/receiving opening 8-2 travels is parallel to a straight line 10-1 along which the collimated light beam outputted from the light emitting/receiving opening 8-1 travels.

The collimator 6-3 among the plurality of collimators 6-1 to 6-3 is connected to the measurer 5 via the optical fiber 7-3 among the plurality of optical fibers 7-1 to 7-3. The collimator 6-3 is provided with a light emitting/receiving opening 8-3. The collimator 6-3 converts light beam transmitted from the measurer 5 via the optical fiber 7-3 into a collimated light beam and outputs the collimated light beam from the light emitting/receiving opening 8-3. Further, the collimator 6-3 transmits light beam reaching the light emitting/receiving opening 8-3 to the measurer 5 via the optical fiber 7-3. The collimator 6-3 is placed such that a straight line 10-3 along which the collimated light beam outputted from the light emitting/receiving opening 8-3 travels is parallel to the straight line 10-1 and, also, such that the straight line 10-2 is positioned between the straight line 10-1 and the straight line 10-3. Further, the collimator 6-3 is fixed to the collimator 6-1 and the collimator 6-2.

The chamber-inside device 3 is equipped with a base wafer 11 and a plurality of optical circuits 12-1 to 12-3. The base wafer 11 is made of single crystalline silicon and has a circular plate shape. The base wafer 11 has a notch 14 formed at an edge of the circular plate thereof. The optical circuit 12-1 among the plurality of optical circuits 12-1 to 12-3 is equipped with a collimator 15-1, a vertical focuser 16-1 and an optical fiber 17-1. The collimator 15-1 is provided with a light receiving/emitting opening 18-1. The collimator 15-1 transmits light beam reaching the light receiving/emitting opening 18-1 to the vertical focuser 16-1 via the optical fiber 17-1. Further, the collimator 15-1 converts light beam transmitted from the vertical focuser 16-1 via the optical fiber 17-1 into a collimated light beam and outputs the collimated light beam from the light receiving/emitting opening 18-1. The collimator 15-1 is placed on one surface of the base wafer 11 and fixed to the base wafer 11 such that a straight line along which the collimated light beam outputted from the light receiving/emitting opening 18-1 travels accords to a straight line parallel to a plane of the base wafer 11.

The vertical focuser 16-1 is provided with a light emitting/receiving opening 22-1. The vertical focuser 16-1 is placed on the surface of the base wafer 11 where the collimator 15-1 is placed such that the light emitting/receiving opening 22-1 intersects with a straight line 24-1. The straight line 24-1 is vertical to the plane of the base wafer 11, and a distance from a center 23 of the base wafer 11 to the straight line 24-1 is set to be of a preset value.

The optical circuit 12-2 among the plurality of optical circuits 12-1 to 12-3 is equipped with a collimator 15-2, a vertical focuser 16-2 and an optical fiber 17-2. The collimator 15-2 is provided with a light receiving/emitting opening 18-2. The collimator 15-2 transmits light beam reaching the light receiving/emitting opening 18-2 to the vertical focuser 16-2 via the optical fiber 17-2. Further, the collimator 15-2 converts light beam transmitted from the vertical focuser 16-2 via the optical fiber 17-2 into a collimated light beam and outputs the collimated light beam from the light receiving/emitting opening 18-2. The collimator 15-2 is placed on the surface of the base wafer 11 where the collimator 15-1 is placed such that a straight line along which the collimated light beam outputted from the light receiving/emitting opening 18-2 travels is parallel to the straight line along which the collimated light beam outputted from the collimator 15-1 travels. Further, the collimator 15-2 is placed such that the collimated light beam outputted from the light receiving/emitting opening 18-2 travels along the straight line 10-2 when the collimated light beam outputted from the light receiving/emitting opening 18-1 travels along the straight line 10-1. The collimator 15-2 is fixed to the base wafer 11.

The vertical focuser 16-2 is provided with a light emitting/receiving opening 22-2. The vertical focuser 16-2 is placed on the surface of the base wafer 11 where the collimator 15-2 is placed such that the light emitting/receiving opening 22-2 intersects with a straight line 24-2. The straight line 24-2 is parallel to the straight line 24-1, and a distance from the center 23 to the straight line 24-2 is equal to the distance from the center 23 to the straight line 24-1. Further, the straight line 24-2 is positioned such that a straight line 25-2 connecting the center 23 and a point of the base wafer 11 intersecting with the straight line 24-2 and a straight line 25-1 connecting the center 23 and a point of the base wafer 11 intersecting with the straight line 24-1 intersect with each other at an angle of 120 degrees.

The optical circuit 12-3 among the plurality of optical circuits 12-1 to 12-3 is equipped with a collimator 15-3, a vertical focuser 16-3 and an optical fiber 17-3. The collimator 15-3 is provided with a light receiving/emitting opening 18-3. The collimator 15-3 transmits light beam reaching the light receiving/emitting opening 18-3 to the vertical focuser 16-3 via the optical fiber 17-3. Further, the collimator 15-3 converts light beam transmitted from the vertical focuser 16-3 via the optical fiber 17-3 into a collimated light beam and outputs (deflects) the collimated light beam from the light receiving/emitting opening 18-3. The collimator 15-3 is placed on the surface of the base wafer 11 where the collimator 15-1 is placed such that a straight line along which the collimated light beam outputted from the light receiving/emitting opening 18-3 travels is parallel to the straight line along which the collimated light beam outputted from the collimator 15-1 travels. Further, the collimator 15-3 is placed such that the collimated light beam outputted from the light receiving/emitting opening 18-3 travels along the straight line 10-3 when the collimated light beam outputted from the collimator 15-1 travels along the straight line 10-1 and the collimated light beam outputted from the collimator 15-2 travels along the straight line 10-2. The collimator 15-3 is fixed to the base wafer 11.

The vertical focuser 16-3 is provided with a light emitting/receiving opening 22-3. The vertical focuser 16-3 is placed on the surface of the base wafer 11 where the collimator 15-3 is placed such that the light emitting/receiving opening 22-3 intersects with a straight line 24-3. The straight line 24-3 is parallel to the straight line 24-1, and a distance from the center 23 to the straight line 24-3 is equal to the distance from the center 23 to the straight line 24-1. Further, the straight line 24-3 is positioned such that a straight line 25-3 connecting the center 23 and a point of the base wafer 11 intersecting with the straight line 24-3 and the straight line 25-1 intersect with each other at an angle of 120 degrees and the straight line 25-3 and the straight line 25-2 intersect with each other at an angle of 120 degrees.

Figure 2:
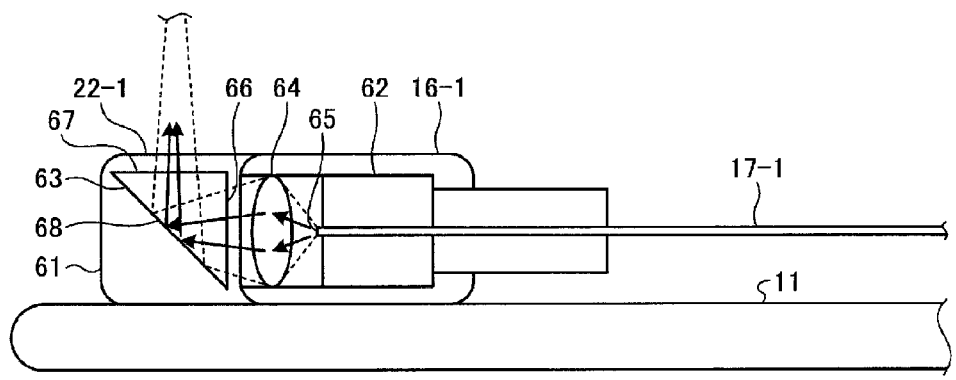
FIG. 2 is a cross sectional view illustrating an example of a vertical focuser of the ranging apparatus according to the exemplary embodiment.

FIG. 2 is a cross sectional view illustrating an example of the vertical focuser 16-1 of the ranging apparatus 1 according to the exemplary embodiment. The vertical focuser 16-1 is equipped with a case 61, a ferrule 62, a prism 63 and a condensing lens 64. The case 61 is provided with the light emitting/receiving opening 22-1. The ferrule 62 is placed within and fixed to the case 61. The ferrule 62 is configured to fix one end of the optical fiber 17-1 in place such that an end surface 65 of the one end of the optical fiber 17-1 near the vertical focuser 16-1 is placed at a preset position within the case 61.

The prism 63 has a prism side surface 66, a prism top surface 67 and a total reflection surface 68. The prism 63 is formed to allow light incident from the prism side surface 66 and reflected on the total reflection surface 68 to be outputted from the prism top surface 67 and, also, to allow light incident from the prism top surface 67 and reflected on the total reflection surface 68 to be outputted from the prism side surface 66. The prism 63 is placed within and fixed to the case 61 such that the prism side surface 66 faces the end surface 65 of the optical fiber 17-1 and the prism top surface 67 faces the light emitting/receiving opening 22-1. Accordingly, the light beam outputted from the prism top surface 67 of the prism 63 is sent to the outside of the case 61 via the light emitting/receiving opening 22-1. Here, the case 61 is placed such that the light beam outputted from the light emitting/receiving opening 22-1 travels along the straight line 24-1 and is fixed to the base wafer 11.

The condensing lens 64 is placed between the end surface 65 of the optical fiber 17-1 and the prism side surface 66 of the prism 63 within the case 61 and is fixed to the case 61. The condensing lens 64 concentrates light beam outputted form the end surface 65 of the optical fiber 17-1 and allows the concentrated light beam to be incident on the prism side surface 66 of the prism 63. Further, the condensing lens 64 concentrates the light beam outputted from the prism side surface 66 of the prism 63 and allows the concentrated light beam to reach the end surface 65 of the optical fiber 17-1.

The vertical focuser 16-2 is formed to be the same as the vertical focuser 16-1. That is, the vertical focuser 16-2 outputs light beam transmitted from the collimator 15-2 via the optical fiber 17-2 from the light emitting/receiving opening 22-2 and transmits light beam reaching the light emitting/receiving opening 22-2 to the collimator 15-2 via the optical fiber 17-2. Further, the vertical focuser 16-2 is placed such that the light beam outputted from the light emitting/receiving opening 22-2 travels along the straight line 24-2. The vertical focuser 16-2 is fixed to the base wafer 11.

The vertical focuser 16-3 is formed to be the same as the vertical focuser 16-1. That is, the vertical focuser 16-3 outputs light beam transmitted from the collimator 15-3 via the optical fiber 17-3 from the light emitting/receiving opening 22-3 and transmits light beam reaching the light emitting/receiving opening 22-3 to the collimator 15-3 via the optical fiber 17-3. Further, the vertical focuser 16-3 is placed such that the light beam outputted from the light emitting/receiving opening 22-3 travels along the straight line 24-3. The vertical focuser 16-3 is fixed to the base wafer 11.

Figure 3:
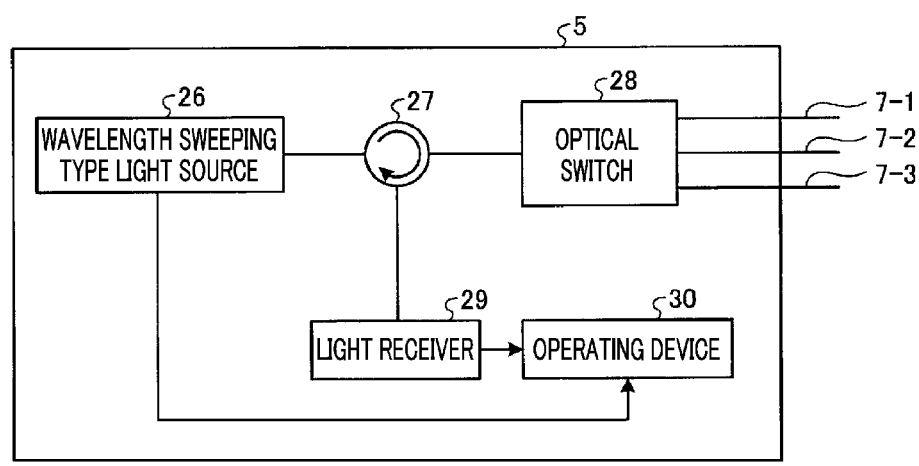
FIG. 3 is a block diagram illustrating an example of a measurer of the ranging apparatus according to the exemplary embodiment.

FIG. 3 is a block diagram illustrating an example of the measurer 5 of the ranging apparatus 1 according to the exemplary embodiment. As depicted in FIG. 3, the measurer 5 includes a wavelength sweeping type light source 26, a circulator 27, an optical switch 28, a light receiver 29 and an operating device 30. The wavelength sweeping type light source 26 is configured to output light beam, a wavelength of which varies with a lapse of time, to the circulator 27. This light beam is an infrared ray which penetrates silicon (Si) and quartz glass. The wavelength sweeping type light source 26 is also configured to output a clock signal to the operating device 30. The circulator 27 is configured to output the light beam outputted to the circulator 27 from the wavelength sweeping type light source 26 to the optical switch 28. Further, the circulator 27 is configured to output the light beam outputted to the circulator 27 from the optical switch 28 to the light receiver 29.

The optical switch 28 is configured to be switched to one of multiple modes. When switched to a first mode, the optical switch 28 transmits the light beam outputted to the optical switch 28 from the circulator 27 to the collimator 6-1 via the optical fiber 7-1. When switched to the first mode, the optical switch 28 outputs the light beam transmitted from the collimator 6-1 via the optical fiber 7-1 to the circulator 27. When switched to a second mode, the optical switch 28 transmits the light beam outputted to the optical switch 28 from the circulator 27 to the collimator 6-2 via the optical fiber 7-2. When switched to the second mode, the optical switch 28 outputs the light beam transmitted from the collimator 6-2 via the optical fiber 7-2 to the circulator 27. When switched to a third mode, the optical switch 28 transmits the light beam outputted to the optical switch 28 from the circulator 27 to the collimator 6-3 via the optical fiber 7-3. When switched to the third mode, the optical switch 28 outputs the light beam transmitted from the collimator 6-3 via the optical fiber 7-3 to the circulator 27.

The light receiver 29 is configured to receive the light beam outputted from the circulator 27 to the light receiver 29, create light intensity data and output the created light intensity data to the operating device 30. The light intensity data indicate multiple intensities respectively corresponding to multiple wavelengths. An intensity corresponding to a specific wavelength among the multiple wavelengths indicates an intensity of light beam having that specific wavelength among the light beams received by the light receiver 29.

The operating device 30 is configured to calculate an interference state of light beam and a distribution of signal intensities of light beams based on the clock signal outputted from the wavelength sweeping type light source 26 and the light intensity data outputted from the light receiver 29. The distribution of the signal intensities of the light beams indicates multiple signal intensities respectively corresponding to multiple optical path lengths. Among the multiple signal intensities, a signal intensity corresponding to a specific optical path length indicates an intensity of light beam having that optical path length. Further, the operating device 30 is configured to calculate distances between multiple objects based on the distribution of the signal intensities of the light beams.

Figure 4:
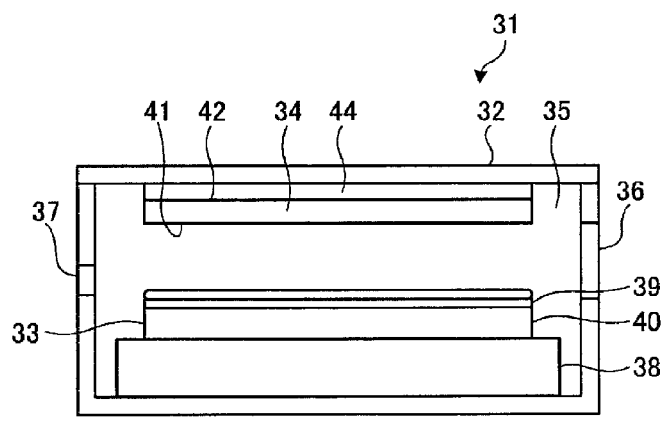
FIG. 4 is a cross sectional view illustrating an example of a substrate processing apparatus to which the ranging apparatus is applied.

The ranging apparatus 1 is used along with a substrate processing apparatus 31 as shown in FIG. 4. FIG. 4 is a cross sectional view illustrating an example of the substrate processing apparatus 31 to which the ranging apparatus 1 according to the exemplary embodiment is applied. The substrate processing apparatus 31 is equipped with a chamber 32, a stage 33, an upper electrode 34 and an upper electrode driving unit 44. An internal space 35 is formed within the chamber 32. The chamber 32 isolates the internal space 35 from an atmosphere outside the chamber 32. The chamber 32 is provided with a carry-in/out opening 36. The carry-in/out opening 36 is formed at a sidewall of the chamber 32. The internal space 35 is connected to a non-illustrated load lock chamber via the carry-in/out opening 36. The carry-in/out opening 36 is opened or closed by a non-illustrated gate valve. Since the chamber 32 is provided with this load lock chamber, a wafer can be carried into or carried out of the internal space 35 without needing to expose the internal space 35 of the chamber 32 to the atmosphere. The chamber 32 is also provided with a window 37. The window 37 is formed of quartz glass and provided at a sidewall of the chamber 32. A user can observe the internal space 35 through this window 37. Further, a material other than the quartz glass may be used to form the window 37. This material needs to transmit the infrared ray and may be, by way of example, but not limitation, sapphire, single crystalline silicon, or the like.

The stage 33 is disposed in a lower portion of the internal space 35 and is placed on a bottom of the chamber 32. The stage 33 includes a support 38, an electrostatic chuck 39 and a base 40. The support 38 is made of an insulator and supported on the chamber 32. The base 40 is made of a conductor and placed on top of the support 38, and is supported on the chamber 32 with the support 38 therebetween to be electrically insulated from the chamber 32. The electrostatic chuck 39 is placed on top of the base 40 to allow the base 40 to be located between the support 38 and the electrostatic chuck 39, and is supported on the chamber 32 with the support 38 and the base 40 therebetween. The electrostatic chuck 39 is configured to hold a wafer which is appropriately placed on the stage 33 by a Coulomb force. At this time, the window 37 is placed to be overlapped with a plane corresponding to a surface of the stage 33 on which the wafer is placed.

The upper electrode 34 is made of a conductive member such as silicon and has a circular plate shape. The upper electrode 34 has a stage facing surface 41 and a rear surface 42. The upper electrode 34 is disposed in an upper portion of the internal space 35 such that the stage facing surface 41 thereof faces the stage 33. The upper electrode 34 is supported at the chamber 32 with the upper electrode driving unit 44 therebetween to be electrically insulated from the chamber 32. The upper electrode driving unit 44 is configured to move the upper electrode 34 in an up-and-down direction to allow the upper electrode 34 to approach or be distanced away from the stage 33. Here, the base 40 is used as a lower electrode with respect to the upper electrode 34.

The substrate processing apparatus 31 is used in a substrate processing such as a plasma etching processing. By way of example, the wafer as a processing target is carried into the internal space 35 of the chamber 32 from the load lock chamber via the carry-in/out opening 36 when the carry-in/out opening 36 is opened, and is placed on the stage 33 and held by the electrostatic chuck 39 by the Coulomb force. After the wafer is held by the electrostatic chuck 39, the carry-in/out opening 36 is closed, and the internal space 35 is adjusted to be turned into a preset atmosphere. After the internal space 35 is set into the preset atmosphere, a high frequency power is supplied between the support 38 of the stage 33 and the upper electrode 34. As the high frequency power is supplied between the support 38 and the upper electrode 34, plasma is generated in the internal space 35. The wafer placed on the stage 33 is etched by the plasma generated in the internal space 35. For example, the window 37 is used to check a state of the wafer being processing in the internal space 35 from the outside of the chamber 32. After the wafer is etched, the carry-in/out opening 36 is opened, and the wafer is carried from the internal space 35 into the load lock chamber via the carry-in/out opening 36.

[Ranging Method]

Figure 5:
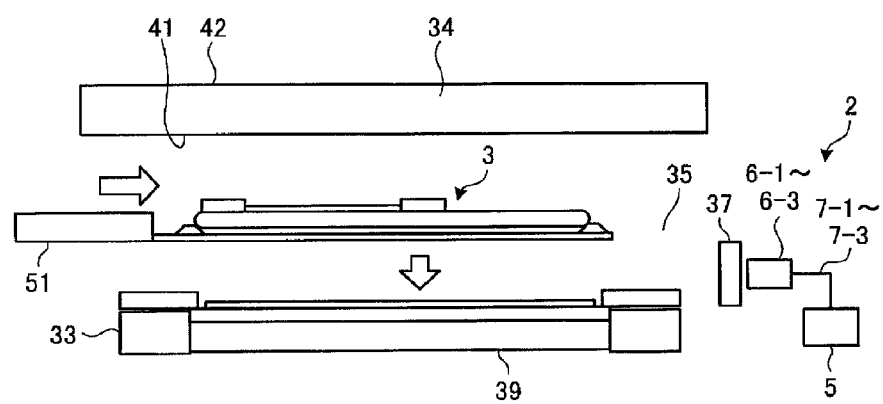
FIG. 5 is a cross sectional view illustrating an example of a chamber when a chamber-inside device of the ranging apparatus according to the exemplary embodiment is carried into an internal space of the substrate processing apparatus.

A ranging method according to the exemplary embodiment is performed by using the aforementioned ranging apparatus 1. In the ranging method, when the carry-in/out opening 36 is opened, the chamber-inside device 3 is carried into the internal space 35 of the chamber 32 from the load lock chamber by a robot hand 51 which is provided in the load lock chamber, as illustrated in FIG. 5. FIG. 5 is a cross sectional view illustrating an example of the chamber 32 when the chamber-inside device 3 of the ranging apparatus 1 according to the exemplary embodiment is carried into the internal space 35 of the substrate processing apparatus 31. The robot hand 51 is also used to carry the wafer to be processed by the substrate processing apparatus 31 into the internal space 35 from the load lock chamber.

Figure 6:
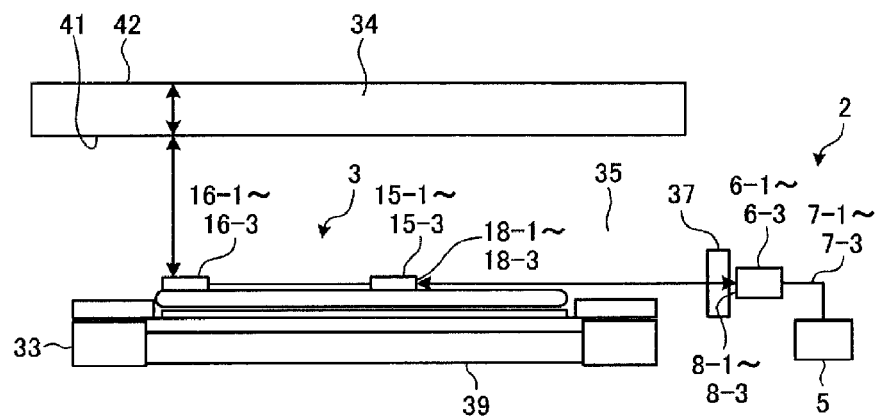
FIG. 6 is a cross sectional view illustrating an example of the chamber when the chamber-inside device of the ranging apparatus according to the exemplary embodiment is appropriately placed on a stage.

After carried into the internal space 35, the chamber-inside device 3 is placed on the stage 33, as illustrated in FIG. 6. FIG. 6 is a cross sectional view illustrating an example of the chamber 32 when the chamber-inside device 3 of the ranging apparatus 1 according to the exemplary embodiment is appropriately placed on the stage 33. The chamber-inside device 3 is appropriately placed on the stage 33 such that the notch 14 of the base wafer 11 is placed at a preset position. As the chamber-inside device 3 is placed on the stage 33 appropriately, the collimators 15-1 to 15-3 are capable of outputting light beams respectively outputted from the light receiving/emitting openings 18-1 to 18-3 to the outside of the chamber 32 through the window 37. The chamber-inside device 3 is held by the electrostatic chuck 39 while being appropriately placed on the stage 33.

Further, the collimators 6-1 to 6-3 of the external device 2 are appropriately placed to be fixed to the chamber 32. If the collimators 6-1 to 6-3 are appropriately placed, the light beam outputted from the collimator 6-1 is capable of reaching the light receiving/emitting opening 18-1 of the collimator 15-1 through the window 37. At this time, the light beam outputted from the collimator 6-2 is capable of reaching the light receiving/emitting opening 18-2 of the collimator 15-2 through the window 37. Further, the light beam outputted from the collimator 6-3 is capable of arriving at the light receiving/emitting opening 18-3 of the collimator 15-3 through the window 37.

After the collimators 6-1 to 6-3 and the chamber-inside device 3 are appropriately arranged, the measuring device 5 outputs the light beam to the collimator 6-1 via the optical fiber 7-1. The light beam outputted to the collimator 6-1 from the measuring device 5 is converted to the collimated light beam by the collimator 6-1 to be outputted from the light emitting/receiving opening 8-1. The light beam outputted from the collimator 6-1 arrives at the light receiving/emitting opening 18-1 of the collimator 15-1 after passing through the window 37. The light beam having reached the light receiving/emitting opening 18-1 is then transmitted to the vertical focuser 16-1 via the optical fiber 17-1.

Figure 7:
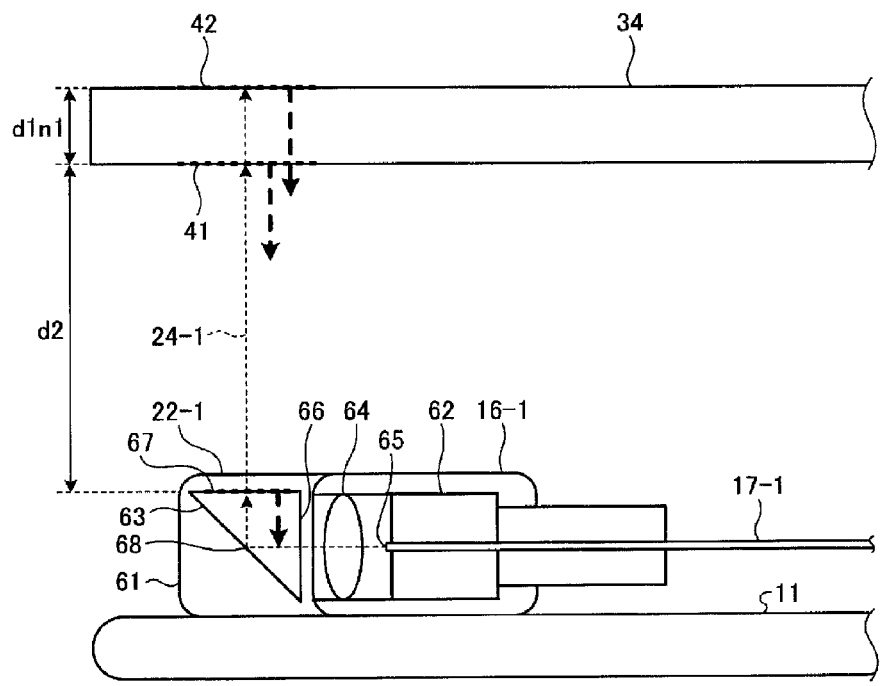
FIG. 7 is a cross sectional view illustrating an example of an optical path of light beam transmitted to the vertical focuser.

FIG. 7 is a cross sectional view illustrating an example of an optical path of the light beam transmitted to the vertical focuser 16-1. The light beam sent to the vertical focuser 16-1 via the optical fiber 17-1 is concentrated by the condensing lens 64 and then arrives at the prism side surface 66 of the prism 63. The light incident on the prism side surface 66 of the prism 63 is then reflected on the total reflection surface 68 and reaches the prism top surface 67 from the total reflection surface 68. A part of the light beam having reached the prism top surface 67 from the total reflection surface 68 is reflected on the prism top surface 67 to be transmitted to the measurer 5 through a path ranging from the prism top surface 67 to the measurer 5. Another part of the light beam having reached the prism top surface 67 from the total reflection surface 68 is outputted to the light emitting/receiving opening 22-1 of the vertical focuser 16-1 from the prism top surface 67 to be outputted from the light emitting/receiving opening 22-1 toward the upper electrode 34 along the straight line 24-1.

The light beam outputted from the light emitting/receiving opening 22-1 reaches a region of the stage facing surface 41 of the upper electrode 34 which intersects with the straight line 24-1. A part of the light beam having reached the stage facing surface 41 of the upper electrode 34 is reflected on the stage facing surface 41 to be transmitted to the measurer 5 through a path ranging from the stage facing surface 41 to the measurer 5. Another part of the light beam having reached the stage facing surface 41 arrives at the rear surface 42 of the upper electrode 34 after penetrating the upper electrode 34. A part of the light beam having reached the rear surface 42 of the upper electrode 34 is reflected on the rear surface 42 to be sent to the measurer 5 through a path ranging from the rear surface 42 to the measurer 5. Another part of the light beam having reached the rear surface 42 of the upper electrode 34 is outputted further upwards from the rear surface 42.

Figure 8:
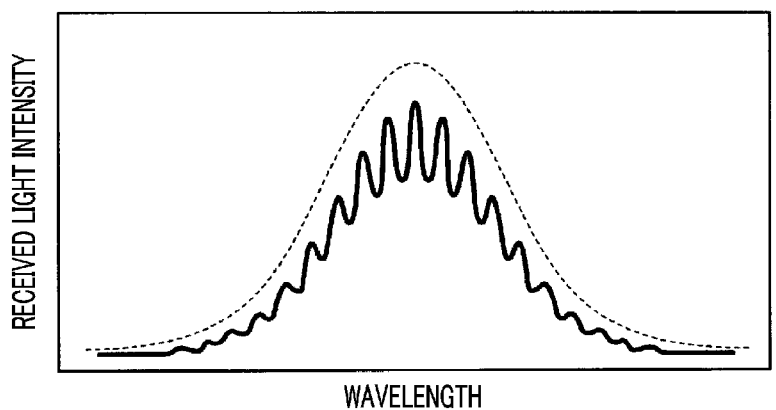
FIG. 8 is a graph showing an example of an intensity distribution of light beam with respect to a wavelength thereof when the light beam is transmitted to the measurer after being reflected on a prism top surface of a prism and a stage facing surface and a rear surface of an upper electrode.
Figure 9:
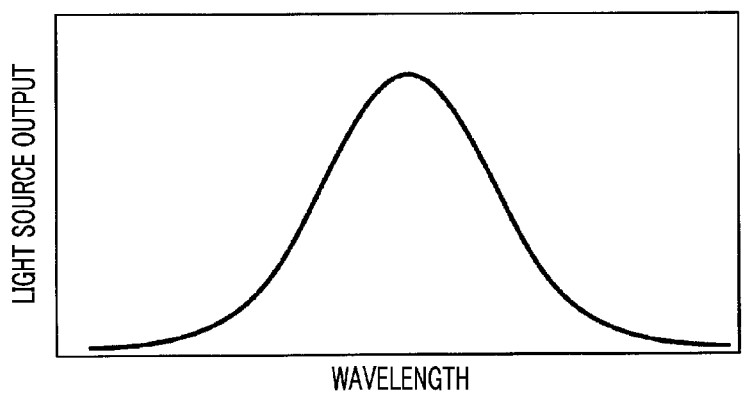
FIG. 9 is a graph showing an example of an intensity distribution of light beam with respect to a wavelength thereof when the light beam is outputted from a wavelength sweeping type light source.
Figure 10:
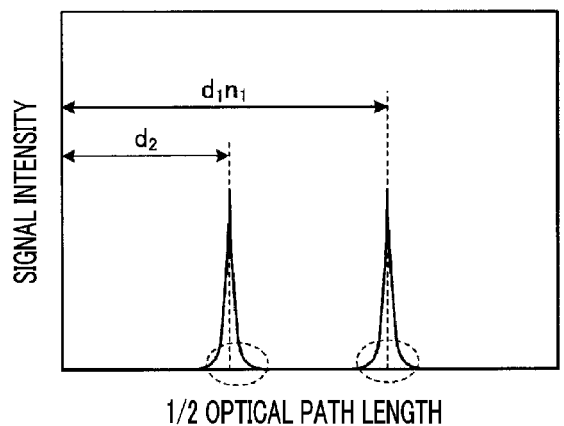
FIG. 10 is a graph showing an example of an intensity distribution of light beam with respect to a ½ optical path length obtained by analyzing the light beam transmitted to the measurer.

If the light beams reflected on the prism top surface 67 of the prism 63 and the stage facing surface 41 and the rear surface 42 of the upper electrode 34 are transmitted to the measurer 5, the light receiver 29 of the measurer 5 measures the intensity distribution of the light beams with respect to the wavelength. FIG. 8 is a graph showing an example of the intensity distribution of the light beams with respect to the wavelength when the light beams are transmitted to the measurer 5 after being reflected on the prism top surface 67 of the prism 63 and the stage facing surface 41 and the rear surface 42 of the upper electrode 34. The operating device of the measurer 5 calculates the signal intensity distribution with respect to the ½ optical path length based on the intensity distribution of the light beam transmitted to the measurer 5 after being reflected on the preset portion and the intensity distribution of the light beam outputted from the wavelength sweeping type light source 26. FIG. 9 is a graph showing an example of the intensity distribution of the light beam with respect to a wavelength when the light beam is outputted from the wavelength sweeping type light source 26. FIG. 10 is a graph showing an example of the signal intensity distribution with respect to the ½ optical path length obtained by analyzing the light beam transmitted to the measurer 5. The graph of FIG. 10 indicates existence of multiple peaks in the signal intensity distribution. The multiple peaks correspond to multiple measurement targets. Each of the multiple measurement targets indicates a portion between two reflection surfaces. As an example, the measurement targets may include a distance between the prism top surface 67 of the prism 63 and the stage facing surface 41 of the upper electrode 34 and a distance between the stage facing surface 41 and the rear surface 42 of the upper electrode 34. The operating device 30 of the measurer 5 calculates the multiple ½ optical path lengths respectively corresponding to the multiple peaks formed in the signal intensity distribution.

The operating device 30 matches the multiple ½ optical path lengths with the multiple measurement targets. In the ½ optical path lengths, a ½ optical path length corresponding to a specific measurement target indicates a half of an optical path length of light beam which travels back and forth to that specific measurement target. The operating device 30 of the measurer 5 calculates a distance (thickness) of the measurement target based on the ½ optical path length corresponding to the measurement target and a refractive index of the measurement target. The distance of the measurement target equals to a value obtained by dividing the ½ optical path length corresponding to the measurement target by the refractive index of the measurement target. By way of example, a thickness d1 of the upper electrode 34 is calculated by dividing a ½ optical path length d1n1 corresponding to a distance between the stage facing surface 41 and the rear surface 42 of the upper electrode 34 by a refractive index n1 of the upper electrode 34. A distance d2 between the prism top surface 67 of the prism 63 and the stage facing surface 41 of the upper electrode 34 is calculated by dividing a ½ optical path length corresponding to a distance between the prism top surface 67 and the stage facing surface 41 by a refractive index ($\approx 1$) of a gas provided therebetween. As a result, the operating device 30 calculates the distance between the prism top surface 67 of the prism 63 and the stage facing surface 41 of the upper electrode 34. The operating device 30 also calculates a distance between the stage facing surface 41 and the rear surface 42 of the upper electrode 34, that is, the thickness of the portion of the upper electrode 34 intersecting with the straight line 24-1.

Subsequently, the measurer 5 outputs the collimated light beam from the light emitting/receiving opening 8-2 and calculates the distances of the multiple measurement targets based on the light beams having reached the light emitting/receiving opening 8-2. The multiple measurement targets include a distance between the portions of the prism top surface 67 of the prism 63 of the vertical focuser 16-2 and the stage facing surface 41 of the upper electrode 34 which intersect with the straight line 24-2, and a thickness of the portion of the upper electrode 34 which intersects with the straight line 24-2. Thereafter, the measurer 5 outputs the collimated light beam from the light emitting/receiving opening 8-3 and calculates the distances of the multiple measurement targets based on the light beams having reached the light emitting/receiving opening 8-3. The multiple measurement targets include a distance between the portions of the prism top surface 67 of the prism 63 of the vertical focuser 16-3 and the stage facing surface 41 of the upper electrode 34 which intersect with the straight line 24-3, and a thickness of the portion of the upper electrode 34 which intersects with the straight line 24-3.

After the distances of the measurement targets are measured, the chamber-inside device 3 is carried out from the internal space 35 of the chamber 32 into the load lock chamber by the robot hand 51 through the carry-in/out opening 36. After the distances of these measurement targets are measured, the collimators 6-1 to 6-3 are separated from the chamber 32.

According to the above-described ranging method, it is possible to measure the positions of the preset portions of the upper electrode 34 without having to expose the internal space 35 of the chamber 32 to the atmosphere. The user can calculate the distance between the stage 33 and the upper electrode 34 based on these measured multiple distances. The user can calculate a degree of parallelization between a plane of the placing surface of the stage 33 where the chamber-inside device 3 is placed and a plane of the stage facing surface 41 or the rear surface 42 of the upper electrode 34 based on the measured multiple distances. The user can also calculate the thicknesses of the multiple positions of the upper electrode 34 based on the measured multiple distances. By performing this ranging method intermittently, the user can calculate the variation of the thickness of the upper electrode 34 with a lapse of time. Thus, a wear amount of the upper electrode 34 can be calculated.

Figure 11:
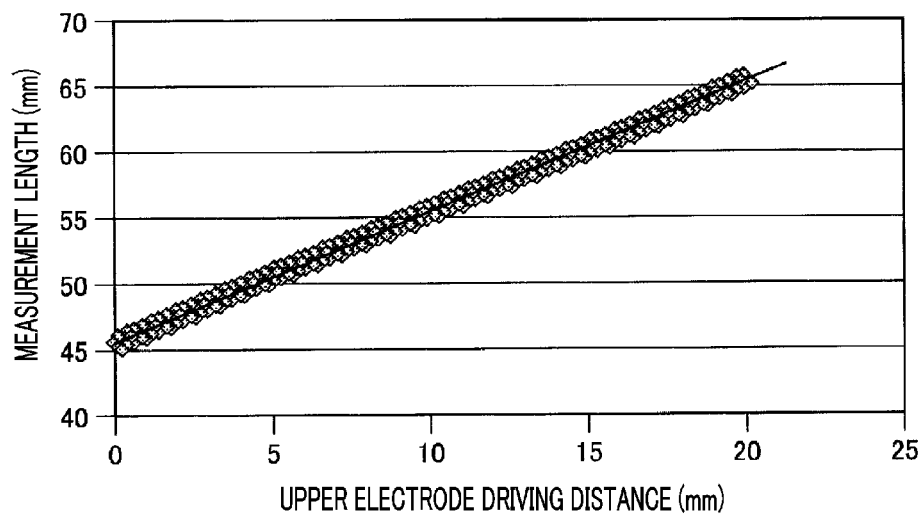
FIG. 11 is a graph showing an example relationship between an upper electrode driving distance and a measurement length in a distance measuring experiment.

FIG. 11 is a graph showing an example relationship between an upper electrode driving distance and a measurement length in a distance measuring experiment. In the distance measuring experiment, whenever the upper electrode 34 is placed at multiple positions by the upper electrode driving unit 44, the distance from the prism top surface 67 of the vertical focuser 16-1 to a portion of the stage facing surface 41 intersecting with the straight line 24-1 is measured by the above-described ranging method. On the graph of FIG. 11, multiple upper electrode driving distances are respectively matched with multiple measurement lengths. Each of the upper electrode driving distances indicates a distance by which the upper electrode 34 is moved by the upper electrode driving unit 44 from a preset reference position in the up-and-down direction, and corresponds to the distance between the upper electrode 34 and the stage 33. Among the multiple measurement lengths, a measurement length corresponding to a preset upper electrode driving distance indicates a measured value of the distance from the prism top surface 67 to the stage facing surface 41 measured by the above-described ranging method when the upper electrode 34 is placed at a position corresponding to the preset upper electrode driving distance.

The graph of FIG. 11 shows that a slope of a straight line indicating a regression equation which approximates the measurement length with respect to the upper electrode driving distance is substantially equal to 1, and implies that the measurement length measured by the above-stated ranging method is substantially correct. Further, stability 3σ of the measurement length calculated by using a standard deviation a of the multiple measurement lengths measured by the ranging method is equal to or less than 35 μm, which implies that it is possible to measure the measurement length stably by using this ranging method.

[Effects of Ranging Apparatus]

The ranging apparatus 1 according to the exemplary embodiment is equipped with the external device 2, the base wafer 11 and the optical circuit 12-1. The external device 2 outputs, through the window 37 which is formed at the chamber 32 in which an internal space is formed, the output light beam into the internal space 35 from the outside of the chamber 32. The base wafer 11 is placed on the stage 33 which is disposed within the internal space 35. The optical circuit 12-1 is fixed to the base wafer 11. The optical circuit 12-1 converts the source light beam into the deflected light beam which travels along the straight line 24-1 which is not parallel to the straight line 10-1 along which the source light beam travels, and converts the reflection light beam, which is reflected on a target object on which the deflected light beam is incident, into a deflected reflection light beam which travels along the straight line 10-1. The straight line 10-1 is an example of a first straight line, and the straight line 24-1 is an example of a second straight line. The external device 2 receives the deflected reflection light beam through the window 37. This ranging apparatus 1 is capable of measuring the position of the target object such as the upper electrode 34 without exposing the internal space 35 of the chamber 32 to the atmosphere.

Further, the optical circuit 12-1 of the ranging apparatus 1 according to the exemplary embodiment is equipped with: the collimator 15-1 configured to concentrate the source light beam to a first transmission light beam; and the optical fiber 17-1 configured to transmit the first transmission light beam to the vertical focuser 16-1. The collimator 15-1 is an example of a first optical device, and the vertical focuser 16-1 is an example of a second optical device. The vertical focuser 16-1 converts the first transmission light beam into a deflected light beam and converts a reflection light beam into a second transmission light beam. The optical fiber 17-1 sends the second transmission light beam to the collimator 15-1. The collimator 15-1 converts the received second transmission light beam into a measurement light beam. In this ranging apparatus 1, the collimator 15-1 and the vertical focuser 16-1 can be placed at two different positions on the base wafer 11.

Further, the ranging apparatus 1 according to the present exemplary embodiment is further equipped with the optical circuit 12-2 fixed to the base wafer 11 and the optical circuit 12-3 fixed to the base wafer 11. The optical circuit 12-2 is an example of a first optical circuit, and the optical circuit 12-3 is an example of a second optical circuit. The optical circuit 12-2 converts the source light beam travelling along the straight line 10-2 after being outputted from the external device 2 into the light beam which travels along the straight line 24-2, and converts the reflection light beam reflected on the upper electrode 34 into the measurement light beam which travels along the straight line 10-2. The straight line 10-2 is an example of a third straight line, and the straight line 24-2 is an example of a fourth straight line. The optical circuit 12-3 converts the source light beam travelling along the straight line 10-3 after being outputted from the external device 2 into the light beam which travels along the straight line 24-3, and converts the reflection light beam reflected on the upper electrode 34 into the measurement light beam which travels along the straight line 10-3. The straight line 10-3 is an example of a fifth straight line, and the straight line 24-3 is an example of a sixth straight line. This ranging apparatus 1 is capable of measuring the positions of the multiple portions of the upper electrode 34 in the state that the chamber-inside device 3 is placed on the stage 33.

Furthermore, the external device 2 of the ranging apparatus 1 according to the exemplary embodiment is equipped with the collimators 6-1 to 6-3. The collimator 6-1 is an example of a first light emitter/receiver; the collimator 6-2, an example of a second light emitter/receiver; and the collimator 6-3, an example of a third light emitter/receiver. Here, the collimator 6-2 and the collimator 6-3 are fixed to the collimator 6-1. This ranging apparatus 1 is capable of easily adjusting the positions of the collimator 6-1, the collimator 6-2 and the collimator 6-3.

The above-described vertical focusers 16-1 to 16-3 are arranged not to be overlapped along a single straight line. However, the vertical focusers 16-1 to 16-3 may be placed to be overlapped with each other along a single straight line. In this configuration, the ranging apparatus 1 may not measure the degree of parallelization of the upper electrode 34 appropriately. In such a case, however, a deformation amount (degree of flatness) indicating a level by which how much the stage facing surface 41 or the rear surface 42 of the upper electrode 34 is bent (curved) may be measured instead.

The chamber-inside device 3 is equipped with the optical circuits 12-1 to 12-3 in the above-described exemplary embodiment. However, the chamber-inside device 3 may be further equipped with other optical circuits. Each of the other optical circuits is equipped with a collimator, a vertical focuser and an optical fiber, the same as the optical circuit 12-1. These collimators are arranged such that they can receive the light beams from the external device 2 when the collimators 15-1 to 15-3 are rotated from a state where they can receive the light beams from the external device 2. Further, the vertical focusers of the other optical circuits may be arranged such that a distance between these vertical focusers and the center 23 of the base wafer 11 is different from the distance between the vertical focusers 16-1 to 16-3 and the center 23. In this configuration, by rotating the chamber-inside device 3 placed on the stage 33, the ranging apparatus 1 is capable of easily measuring positions of more portions of the upper electrode 34.

Although the above-described external device 2 is equipped with the collimators 6-1 to 6-3, the collimators 6-2 and 6-3 except the single collimator 6-1 may be omitted. In this case as well, the ranging apparatus 1 is still capable of measuring the position of the target object such as the upper electrode 34 without exposing the internal space 35 of the chamber 32 to the atmosphere.

Further, the collimator 6-1 may be replaced by an optical device other than the collimator. By way of example, such an optical device may be a focuser. In this case, the focuser concentrates the light beam transmitted from the measurer 5 via the optical fiber 7-1 and outputs the concentrated light beam from the light emitting/receiving opening 8-1. Further, the focuser concentrates the light beam reaching the light emitting/receiving opening 8-1 and transmits the concentrated light beam to the measurer 5 via the optical fiber 7-1. Like the collimator 6-1, the collimators 6-2 and 6-3 may be replaced by other optical devices. Even if the collimators 6-1 to 6-3 are replaced by the other optical devices, the ranging apparatus is still capable of measuring the position of the target object easily.

Moreover, the collimator 15-1 may be replaced by an optical device other than the collimator. By way of example, such an optical device may be a focuser. In this case, the focuser concentrates the light beam reaching the light receiving/emitting opening 18-1 and transmits the concentrated light beam to the vertical focuser 16-1 via the optical fiber 17-1. Further, the focuser concentrates the light beam transmitted from the vertical focuser 16-1 via the optical fiber 17-1 and outputs the concentrated light beam from the light receiving/emitting opening 18-1. Like the collimator 15-1, the collimators 15-2 and 15-3 may be replaced by other optical devices. Even if the collimators 15-1 to 15-3 are replaced by the other optical devices, the ranging apparatus is still capable of measuring the position of the target object easily.

In addition, the optical fiber 17-1 may be configured as a light transmitter other than the optical fiber. By way of non-limiting example, such a light transmitter may be an optical system using a mirror and an optical waveguide. Like the optical fiber 17-1, the optical fibers 17-2 and 17-3 may be configured as other light transmitters. Even if the optical fibers 17-1 to 17-3 are replaced by the other light transmitters, the ranging apparatus is still capable of measuring the position of the target object easily.

The above-described base wafer 11 is made of the single crystalline silicon. However, the base wafer 11 may be formed of another material as long as the corresponding material does not have any adverse influence upon the substrate processing when the base wafer 11 is placed in the internal space 35. By way of non-limiting example, such a material may be SiC, quartz, or ceramics. Further, although the notch 14 is formed at the base wafer 11, an orientation flat may be formed instead. In such a case, the chamber-inside device 3 can be appropriately placed on the stage 33 by using the orientation flat such that the light beams outputted from the light receiving/emitting openings 18-1 to 18-3 are outputted to the outside of the chamber 32 through the window 37.

The exemplary embodiments stated above are not intended to be anyway limiting. The above-described exemplary embodiments may be omitted, substituted and modified in various ways without departing from the scope and the spirit of claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A ranging apparatus for use in a plasma processing chamber having an internal space and a window, comprising:
    at least one external light emitting device disposed external to the plasma processing chamber, the external light emitting device being configured to emit at least one source light beam to the internal space through the window;
    a base wafer disposed on a stage in the internal space;
    at least one optical circuit fixed to the base wafer, the optical circuit being configured to deflect the source light beam to a target in the internal space, and to deflect a reflection light beam to the window, the reflection light beam being reflected from the target; and
    at least one external light receiving device disposed external to the plasma processing chamber, the external light receiving device being configured to receive the deflected reflection light beam through the window.

2. The ranging apparatus of claim 1, wherein the base wafer has a notch or an orientation flat at an edge of the base wafer.

3. A method of measuring a distance from a wafer to a target using the ranging apparatus as claimed in claim 1, the method comprising:
    placing the base wafer on the stage in the internal space;
    emitting the source light beam from the at least one external light emitting device to the at least one optical circuit while the base wafer is being placed on the stage; and calculating a distance from the base wafer to the target based on the reflection light beam.

\* \* \* \* \*